Dec. 24, 1968 C. P. J. SUVERKROPP ET AL 3,417,865

FLAT PACKAGE CARRIER BLOCK AND ASSEMBLY

Filed Oct. 3, 1966

INVENTORS
Claus P. J. Suverkropp
Charles M. Bodine
BY
Attorneys

United States Patent Office 3,417,865
Patented Dec. 24, 1968

3,417,865
FLAT PACKAGE CARRIER BLOCK AND ASSEMBLY

Claus P. J. Suverkropp, Sunnyvale, and Charles M. Bodine, Los Altos, Calif., assignors to Signetics Corporation, Sunnyvale, Calif., a corporation of California Filed Oct. 3, 1966, Ser. No. 583,919
10 Claims. (Cl. 206—46)

ABSTRACT OF THE DISCLOSURE

A flat package containing a semiconductor device having a plurality of spaced leads extending from opposite ends of the package and a carrier block therefor. The carrier is formed with a large recess between the end to receive the flat package and with a plurality of ribs forming recesses to receive the leads. Means are provided on certain of the ribs to hold the flat package in the carrier. Other means are provided to aid in removing the flat package from the carrier.

This invention relates to a carrier block and assembly and more particularly to a carrier block suitable for use with flat packages utilized for packaging integrated circuits and an assembly thereof.

Carriers have heretofore been provided for the flat packages which are utilized for packaging integrated circuits. However, all of these carriers have had certain disadvantages. In one type of carrier, if the carrier was turned upside down, the flat package had a tendency to fall out. In others, a two-piece construction is utilized with a cover which is relatively expensive and awkward to use. There is, therefore, a need for a new and improved carrier for flat packages.

In general, it is an object of the present invention to provide a carrier block which is particularly adapted for carrying flat packages containing integrated circuits and an assembly thereof which overcomes the above named disadvantages.

Another object of the invention is to provide a carrier block of the above character in which the flat package can be readily mounted in the carrier and also readily removed from the carrier.

Another object of the invention is to provide a carrier block of the above character in which the integrated circuit carried by the flat package can be readily tested while the package is in the carrier block.

Another object of the invention is to provide a carrier block of the above character which has good environmental characteristics and which has good insulating properties.

Another object of the invention is to provide a carrier block of the above character which can be readily molded and which is at least slightly flexible.

Another object of the invention is to provide a carrier block of the above character which can be utilized with machine loading and unloading.

Another object of the invention is to provide a carrier block of the above character which can be bulk fed.

Additional objects and features of the invention will appear from the following description in which the preferred embodiment is set forth in detail in conjunction with the accompanying drawings.

Referring to the drawings.

Figures 1, 2, 3, 4:
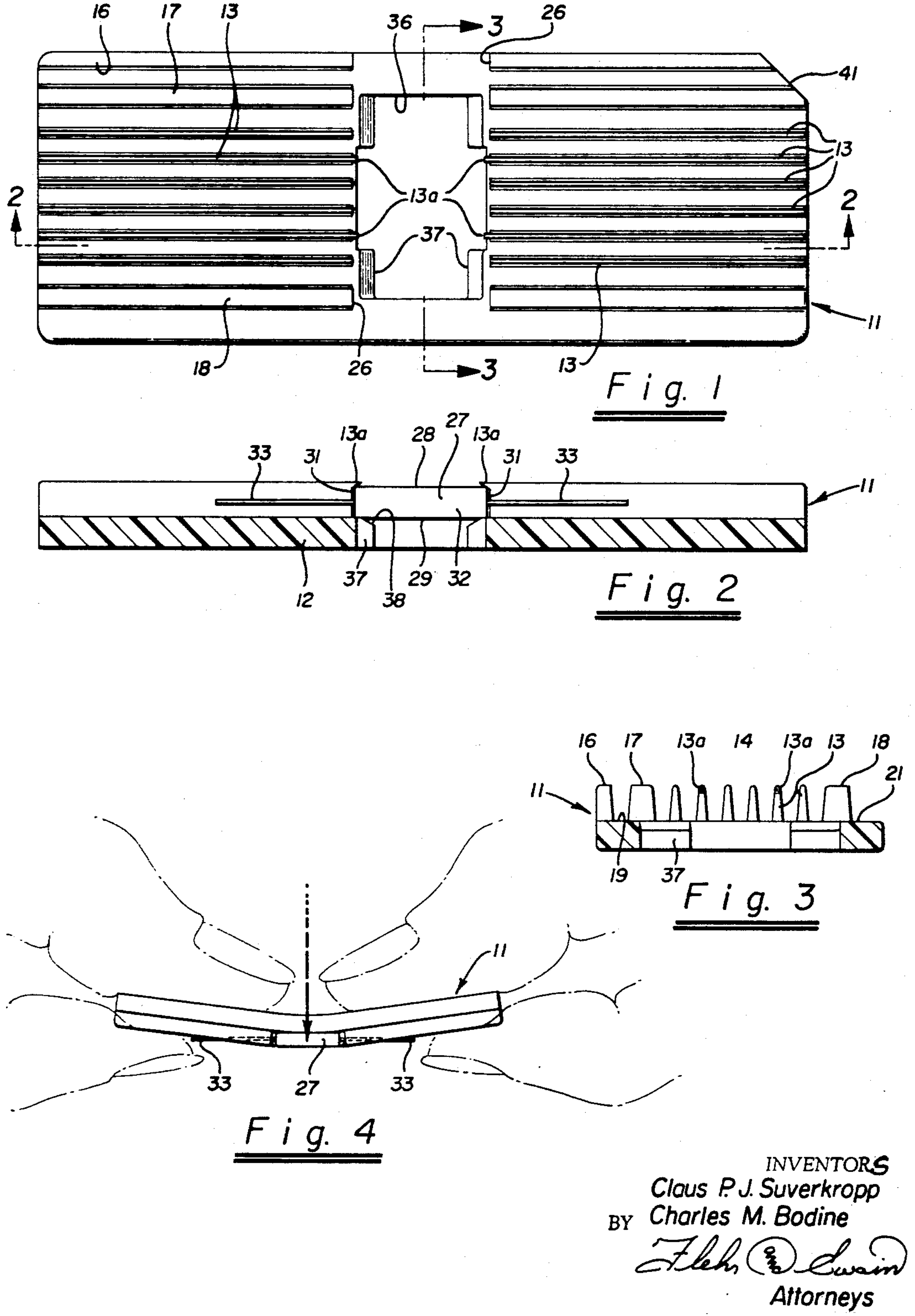
FIGURE 1 is a plan view of a carrier block incorporating the present invention.
FIGURE 2 is a cross-sectional view taken along the line 2—2 of FIGURE 1 and showing a flat package in broken lines mounted therein.
FIGURE 3 is a cross-sectional view taken along the line 3—3 of FIGURE 1.
FIGURE 4 is a side elevational view illustrating the manner in which a flat package is ejected from the carrier block.

In general, the carrier block incorporating the present invention is utilized in conjunction with a flat package which contains a semiconductor device having a plurality of spaced parallel leads extending from opposite ends of the package. The carrier block is formed of a body of a relatively rigid insulating material. The body is also formed with a plurality of spaced ribs and with recesses between the ribs which are adapted to receive the leads of the flat package. A large recess is formed in the body between the ends thereof and is adapted to receive the flat package with the leads extending from the flat package into the parallel recesses. Certain of the ribs are provided with portions which extend over the large recess and over the flat package carried within the recess to hold the flat package in the carrier block. The body is formed of a deformable material so that the body can be deformed or flexed to move the projections overlying the flat package away from the flat package to permit the flat package to be readily removed from the carrier block. The body may be provided with a hole extending through the body and opening into the large recess so that a tool or other device can be positioned through the hole to dislodge the flat package from the carrier block.

More particularly as shown in the drawings, the carrier block consists of a body 11 formed of a suitable insulating material such as Delrin. As hereinafter explained, it is desirable that the material utilized be able to withstand relatively wide temperature ranges as, for example, from −55° C. to +125° C., so that the carrier block can be used during the testing of the integrated circuits mounted in the flat packages carried in the carrier blocks. The body 11 can be formed in any suitable manner such as molding. As shown particularly in FIGURES 1 and 2, the body is substantially rectangular in plan. The body is provided with a relatively flat planar bottom surface 12. The body 11 is also formed with a plurality of spaced parallel vertically upstanding ribs 13 which extend longitudinally of the body and which form a plurality of spaced parallel recesses 14 therebetween also extending longitudinally of the body. The number of recesses is determined by the number of leads on the flat package which is to be carried by the body. For example, in carrying a 14-lead flat pack, seven of such recesses 14 are provided, whereas in carrying a 10-lead flat pack, only five of the recesses 14 are provided. As can be seen from FIGURE 3, the ribs 13 are relatively narrow. Additional thicker or wider ribs 16, 17 and 18 are provided which are parallel to each other and parallel to the ribs 13. A recess is formed between the ribs 16 and 17. The rib has its outer side flush with the side of the body 11, whereas the rib 18 is positioned inwardly from the opposite side to provide a ledge 21 which extends the length of the body and is parallel to the rib 18.

A large recess 26 is formed on the body 11 intermediate the ends of the body. As can be seen from FIGURE 1, the recess is substantially rectangular and has its longitudinal axis extending at right angles to the body 11. As shown in FIGURE 2, the recess 26 is of such a size so that it can readily receive a flat package 27. The flat package is substantially rectangular and is provided with spaced outer top and bottom walls 28 and 29. It is also provided with spaced parallel side walls 31 and spaced parallel end walls 32 which extend perpendicular to the top and bottom walls 28 and 29. A plurality of spaced parallel leads 33 extend from each of the side walls 31 and have such a spacing that they are adapted to be disposed within the recesses 14 formed in the body 11. As is well known to those skilled in the art, the leads 33 may be connected to an integrated circuit device (not shown) of a conventional construction which is packaged in the package 27.

The body 11 is also formed with a substantially rectangular hole 36 which is in general alignment with the large recess 26 but which is slightly smaller than the recess 26. The body 11 is also provided with four lips 37 which are disposed in the corners of the rectangular hole 36. The lips 37 extend parallel to the long sides of the hole 36 and are parallel to each other. Each of the lips is provided with a downwardly and inwardly inclined bevel 38 as can be seen particularly from FIGURE 2. The body 11 is also provided with a chamfer 41 on one corner of the body 11 for a purpose hereinafter described.

Means is carried by the body for retaining the flat pack carried thereby in the bock and takes the form of projecting portions or teats 13*a* which are formed on certain of the ribs 13 and which are adapted to overlie the package when the package is disposed within the recess 35. As can be seen from FIGURES 1 and 2, two of the projecting portions 13*a* have been provided on each side of the recess 26 and overlie the hole 36. The projecting portions are spaced apart and are parallel to each other and form oppositely facing pairs which overlie the opposite side walls 31 of the flat pack. As can be seen, the upper surfaces of the ribs 13 are substantially flat and parallel to the bottom surface 12 and that the projecting portions 13*a* continue this flat surface and are provided with an undercut 42 which is adapted to receive the flat package so that the flat package 27 can be readily retained beneath the same.

In utilizing the carrier block, the flat package 27 can be inserted therein by dropping it with its leads onto the body or block 11 with the package in general alignment with the recess 26 and the leads in alignment with the recesses 14. The flat package 27 can then be snapped into place by pushing the body over the resilient ears or projections 13*a* so that the flat package 27 comes to rest upon the lips 37 and with the leads 33 disposed within the recesses and engaging the bottom walls of the recesses so that the leads are substantially below the top surfaces of the ribs 13 and are protected by the ribs 13.

When the flat package has been positioned in the carrier block in this manner, the carrier block can be inverted or shaken and the flat package will not accidentally fall out. It is, in fact, retained therein so that the carrier block with the package can be moved through various types of operations without any accidental dislodgement of the package from the block. With the package mounted in such a carrier block, the carrier block with the package therein can be machine fed which is possible because the machine can sense the chamfer 41 and properly position the block for feeding. The chamfer 41 also makes it possible to visually inspect the block to determine which lead of the flat package is lead #1. The ledge or notch 21 provided on the body makes it possible to determine whether the carrier block is being fed into the machine with the proper side. If the improper side is being fed to the machine, the machine can reject the same. The machine can also readily detect whether or not the carrier block is being fed upside down.

In addition to protecting the leads, the carrier block serves to hold the leads in the proper position for testing. Since the leads are exposed in the carrier block, the integrated circuit can be tested while it is carried by the carrier block. The carrier block is constructed of such a material that it can withstand the environmental tests which the flat package must undergo to determine whether or not the integrated circuit therein meets the desired quality standards. Thus, for example, it should be able to withstand the environmental test ranging from $-55°$ C. to $+125°$ C. Since the block is formed of insulating material, it can be readily used as a test fixture in testing the integrated circuit.

Thus, it can be seen that when the flat package is mounted in the carrier block, the combination can go through the remaining production stages as, for example, testing, final test, marking and packaging while still being retained by the carrier block. After it is packaged, the carrier block serves a convenient means for transporting the flat package without any danger of endangering the leads. After the carrier block with the flat package mounted therein has been shipped to and received by the customer, the customer can remove the carrier block with the flat package therein and test and inspect same. Thereafter, if it is desired to remove the flat package from the carrier block, the carrier block is flexed slightly as shown in FIGURE 4, either manually or by machine, along a line which is substantially perpendicular to the longitudinal axis of the carrier block but which extends through the center of the recess 26 to cause the overhanging portions 13*a* to be flexed away from over the flat package to permit the flat package 27 to drop therefrom or to permit the flat package to be pushed out of the carrier block by inserting a tool or other small device through the hole 36 and engaging the package 27 and pushing it out of the carrier block. If desired, the carrier block can be refilled with another flat package.

From the foregoing, it can be seen that the construction of the carrier block has many advantages. The hole 36 which is provided permits visual inspection to determine whether or not there is a flat package in the carrier. It also makes it possible to apply a hot probe to the bottom of the flat package during test if desired. The hole also makes it possible to utilize automatic machinery to eject the flat package from the carrier block if desired. The recess 26 which has been formed serves as a cutaway to permit ready flexing of the body or block 11 in the manner shown in FIGURE 4 and to thereby permit the ready removal of the flat package, either by hand or by automatic machinery. The carrier block is of a type which is relatively inexpensive and, if desired, can be thrown away after use.

We claim:

1. In a carrier block for a flat package containing a semiconductor device and having a plurality of spaced parallel leads extending from opposite ends of the package and being connected to the semiconductor device, a body formed of a relatively rigid material having a pair of spaced ends and a pair of spaced sides, said body being formed with a large recess between the ends of the same extending completely across the body and opening through the sides of the body, said body also being formed with a plurality of spaced parallel upstanding ribs with spaced parallel recesses disposed between the ribs on opposite sides of said large recess and adapted to receive the leads of the flat package, said body being adapted to receive said package with the package being disposed in the large recess and with the leads extending into the recesses between the spaced upstanding parallel ribs, certain of said ribs on opposite sides of said large recess being formed with projections extending into said large recess and adapted to overlie the package when it is disposed in said large recess, said body being bendable between the ends of the same in the region of the large recess about an axis generally perpendicular to the sides of the body whereby said projections may be moved from positions overlying said flat package to facilitate removal of the flat package from the large recess.

2. A carrier block as in claim 1 wherein said block is formed of an insulating material.

3. A carrier block as in claim 2 wherein said carrier block has a substantially rectangular configuration having four corners, one of said corners being provided with a chamfer and one side of said body being formed with a ledge.

4. A carrier block as in claim 1 wherein said body is formed with an opening extending through said large recess.

5. A carrier block as in claim 4 wherein said opening has substantially the same size as said package and wherein lips are formed in the corners of said opening and are adapted to carry the package.

6. A carrier block as in claim 1 wherein said body is formed with a substantially planar bottom surface and wherein the upper surfaces of the ribs lie in a substantially common plane.

7. In an assembly of the character described, a flat package consisting of a body of insulating material having a semiconductor device mounted therein, a plurality of spaced parallel leads mounted in the body and extending from opposite sides of the body and being connected to said semiconductor device, a carrier block for carrying said flat package, said carrier block consisting of a body formed of a relatively rigid material, said body being formed with a plurality of spaced parallel upstanding ribs with spaced parallel recesses formed between the ribs and extending longitudinally of the body, a large recess formed in the body between the ends thereof and opening into the spaced parallel recesses, said flat package being disposed in said large recess and having its leads extending into the spaced parallel recesses, said ribs being formed with spaced parallel projections overlying opposite sides of the flat package and serving to retain the package within the large recess, said body being deformable in the region of said large recess to permit the projections overlying the flat package to be moved away from a position overlying the flat package to permit the flat package to be readily removed therefrom.

8. An assembly as in claim 7 wherein said flat package is substantially rectangular and wherein said carrier block is substantially rectangular but has a size which is substantially greater than the size of the flat package.

9. An assembly as in claim 7 wherein said recesses have a sufficient depth so that said leads are substantially below the upper surface of the ribs and wherein the leads are accessible through the recesses.

10. An assembly as in claim 7 wherein the body forming said carrier block is provided with an opening in alignment with the flat package and with lips in the corner of said opening.

References Cited

UNITED STATES PATENTS

| | | | |
|---|---|---|---|
| 2,228,493 | 1/1941 | Will. | |
| 3,048,268 | 8/1962 | Rocchi et al. | 206—65 |
| 3,124,248 | 3/1964 | Geoffrion et al. | 206—65 |

MARTHA L. RICE, *Primary Examiner.*

U.S. Cl. X.R.

206—72; 217—26.5